United States Patent
Lee

(10) Patent No.: US 9,378,000 B1
(45) Date of Patent: Jun. 28, 2016

(54) DETERMINATION OF UNREACHABLE ELEMENTS IN A DESIGN

(71) Applicant: Synopsys, Inc., Mountain View, CA (US)

(72) Inventor: Vernon Lee, Mountain View, CA (US)

(73) Assignee: SYNOPSYS, INC., Mountain View, CA (US)

( * ) Notice: Subject to any disclaimer, the term of this patent is extended or adjusted under 35 U.S.C. 154(b) by 88 days.

(21) Appl. No.: 14/155,272

(22) Filed: Jan. 14, 2014

(51) Int. Cl.
- G06F 9/44 (2006.01)
- G06F 9/45 (2006.01)
- G06F 9/455 (2006.01)
- G06F 17/50 (2006.01)
- G06F 9/445 (2006.01)

(52) U.S. Cl.
CPC *G06F 8/443* (2013.01); *G06F 8/75* (2013.01); *G06F 17/5045* (2013.01); *G06F 8/34* (2013.01); *G06F 9/44505* (2013.01)

(58) Field of Classification Search
CPC . G06F 9/3897; G06F 9/3455; G06F 17/5045; G06F 8/443; G06F 8/34; G06F 8/35; G06F 8/40; G06F 8/433; G06F 9/44505; G06F 17/5036; G06F 17/504; G06F 17/5022; G06F 17/5031; G06F 11/3636; G06F 8/75
See application file for complete search history.

(56) References Cited

U.S. PATENT DOCUMENTS

| | | | | |
|---|---|---|---|---|
| 6,874,134 | B1* | 3/2005 | Collin | G06F 17/5045 716/103 |
| 7,287,235 | B1* | 10/2007 | Hasteer | G06F 17/504 327/158 |
| 7,398,424 | B2* | 7/2008 | Higuchi | G06F 17/5031 714/30 |
| 7,599,981 | B2* | 10/2009 | Ekner | G06F 7/724 708/625 |
| 8,458,679 | B2 | 6/2013 | Archambault | |
| 8,615,748 | B2* | 12/2013 | Doyle | G08F 8/75 717/156 |
| 2003/0005393 | A1* | 1/2003 | Kawamoto | G06F 17/5022 716/103 |
| 2004/0243339 | A1* | 12/2004 | Maruyama | G01R 31/318307 702/124 |
| 2006/0248518 | A1* | 11/2006 | Kundert | G06F 17/5036 717/140 |
| 2007/0169039 | A1* | 7/2007 | Lin | G06F 8/34 717/146 |
| 2010/0313175 | A1* | 12/2010 | Petlin | G06F 17/504 716/106 |
| 2011/0289485 | A1* | 11/2011 | Mejdrich | G06F 11/3636 717/128 |
| 2013/0125097 | A1* | 5/2013 | Ebcioglu | G06F 17/5045 717/136 |
| 2013/0290693 | A1* | 10/2013 | Guerrero | G06F 9/44505 713/1 |

OTHER PUBLICATIONS

Juan-Carlos Baraza et al., Enhancement of Fault Injection Techniques Based on the Modification of VHDL Code, Jun. 2008, [Retrieved on Feb. 15, 2016]. Retrieved from the internet: <URL: http://ieeexplore.ieee.org/stamp/stamp.jsp?tp=&arnumber=4515957> 14 Pages (693-706).*

(Continued)

*Primary Examiner* — Thuy Dao
*Assistant Examiner* — Anibal Rivera
(74) *Attorney, Agent, or Firm* — HIPLegal LLP; Judith Szepesi

(57) ABSTRACT

A method and apparatus for performing compiler optimizations is described. The method determines one or more impossible values for a variable in a program code based on a plurality of values of the variable. The method propagates the one or more impossible values for the variable throughout the program code. The method identifies a set of unreachable targets in the program code based on the propagated impossible values for the variable. The method removes objects associated with the set of unreachable targets.

21 Claims, 7 Drawing Sheets

(56) References Cited

OTHER PUBLICATIONS

Prithviraj Banerjee et al., Overview of a Compiler for Synthesizing MATLAB Programs onto FPGAs, Mar. 2004 IEEE, [Retrieved on Feb. 15, 2016]. Retrieved from the internet: <URL: http://ieeexplore.ieee.org/stamp/stamp.jsp?tp=&arnumber=1281802> 13 Pages (312-324).*

* cited by examiner

```
m = 0;

=> m will always have the value 0
```

FIG. 2A (Prior Art)

```
If (a)
    m = 0;
else
    m = 2;

=> m may have the value 0 or it
    may be 2, but it cannot have any
    other value
```

DETERMINATION OF UNREACHABLE ELEMENTS IN A DESIGN

FIELD

The present invention relates to compiler optimization and in particular to improving code coverage for a program written in a hardware description language for electronic design automation.

BACKGROUND

A hardware description language (HDL) is a specialized computer language used to describe the structure, design and operation of electronic circuits, and most commonly, digital logic circuits. A hardware description language enables a precise, formal description of an electronic circuit that allows for the automated analysis, simulation, and simulated testing of an electronic circuit. It also allows for the compilation of an HDL program into a lower level specification of physical electronic components, such as the set of masks used to create an integrated circuit. HDLs form an integral part of Electronic design automation systems.

HDLs are processed by a compiler (usually called a synthesizer). For HDLs, 'compiler' refers to synthesis, a process of transforming the HDL code listing into a physically realizable gate netlist. The netlist output can take any of many forms: a "simulation" netlist with gate-delay information, a "handoff" netlist for post-synthesis place and route, or a generic industry-standard EDIF format.

A compiler is a program that transforms source code written in a high-level programming language to a lower level language (e.g., assembly language or machine code) in order to create an executable program. FIG. 1 illustrates a typical flowchart of a compiler. Specifically, this figure describes a process 100 that transforms source code written in a high level programming language to machine code. The process 100 begins by using, at block 105, a lexical analyzer to convert string of characters in the source code into string of tokens.

At block 110, the process 100 uses a parser to construct a parse tree based on the string of tokens. At block 115, the process 100 uses a semantic analyzer to add semantic information to the parse tree. At block 120, the process 100 uses a translator to convert the parse tree to low-level intermediate code.

At block 125, the process 100 uses an optimizer to optimize the low-level intermediate code. At block 130, the process 100 converts the optimized low-level intermediate code to machine code. An optimizing compiler is a compiler that tries to minimize or maximize some attributes of an executable computer program. The most common requirement is to minimize the time taken to execute a program; a less common one is to minimize the amount of memory occupied. Compiler optimization is generally implemented using a sequence of optimizing transformations, algorithms that take a program and transform it to produce a semantically equivalent output program that uses fewer resources.

Code coverage is a measure used to describe the degree to which the source code of a program is tested by a particular test suite. Generally, a program with high code coverage has been more thoroughly tested and has a lower chance of containing software bugs than a program with low code coverage. Sometimes in electronic design automation, 100% code coverage of a design written in HDL is required as part of the design signoff process.

In electronic design, code coverage targets are inferred from designs written in HDL. Designs typically contain many inferred coverage targets (combinations of values, executable lines, value transitions, etc.) that cannot be reached. These unreachable coverage targets take up resources in electronic design and require a substantial amount of time to test in order to achieve high code coverage and coverage closure. Currently, unreachable coverage targets that cannot be removed automatically must be identified and removed manually, which is a time consuming and error prone process.

BRIEF DESCRIPTION OF THE FIGURES

The present invention is illustrated by way of example, and not by way of limitation, in the figures of the accompanying drawings and in which like reference numerals refer to similar elements and in which:

FIG. 2A illustrates an example of a traditional analysis for performing constant propagation.

FIG. 2B illustrates an example of an analysis for performing constant propagation in accordance with one embodiment.

DETAILED DESCRIPTION

Figure 1:
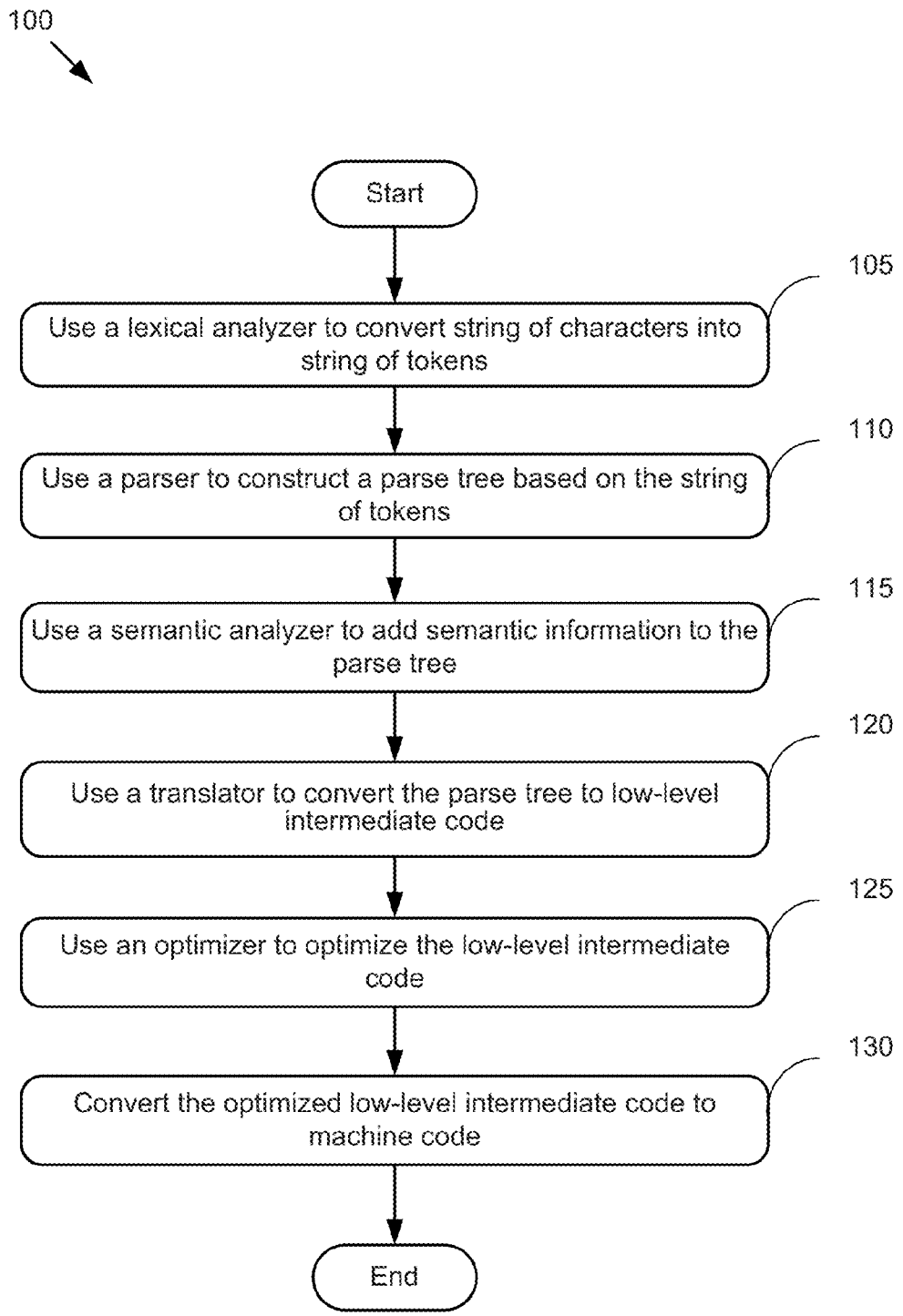
FIG. 1 illustrates a typical flowchart of a prior art compiler.

A novel approach for improving code coverage for a circuit design written in HDL is described. One embodiment automatically finds lines of code, signal values, and expressions that can never execute and removes the unreachable code coverage targets from the list of uncovered objects, thus improving the coverage scores and allowing the system to focus on the remaining code coverage targets. One embodiment finds unreachable code coverage targets by considering a new category of constant values and then propagating this new type of values through port connects and assignments to find other expressions with the same type of constant values.

In an exemplary embodiment, a method and apparatus determines a set of impossible values for a variable in a program code based on a plurality of values of the variable. The method propagates the set of impossible values for the variable throughout the program code. The method identifies a set of unreachable targets in the program code based on the propagated impossible values for the variable, and in one embodiment removes the set of unreachable targets.

To remove the set of unreachable targets, in one embodiment, the method removes circuits corresponding to the set of unreachable targets from the synthesis. In another embodiment, the method removes the set of unreachable targets by deleting the set of unreachable targets from the program code. In yet another embodiment, the method removes the set of unreachable targets by removing the set of unreachable targets from testing and the calculation of code coverage.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

Constant propagation is a compiler optimization technique used by many modern compilers. Constant propagation is the process of substituting the values of known constants in expressions at compile time. Terms in constant expressions are typically simple literals, such as the integer literal 2, but can also be variables whose values are not modified, or variables explicitly marked as constant, as well as intrinsic functions applied to constant values.

The goal of constant propagation is to discover values that are constant for all possible executions of a program and to propagate these constant values as far forward through the program as possible. Given a program, the compiler would try to find out for every point in the program (after every statement), which variables have constant values, and which do not. A variable has a constant value at a certain point if every execution that reaches that point gives that variable the same constant value.

Constant propagation techniques serve several purposes in optimizing compilers. For example, constant propagation eliminates the need for expressions evaluated at compile time to be evaluated at execution time, thus saving execution time. Unreachable code is discovered by identifying conditional branches that always take one of the possible branch paths. In one embodiment, code that is never executed can be deleted as a result of constant propagation, thus reducing the size of the executable machine code and saving memory space during execution of the program. Detection of paths never taken also simplifies the control flow of a program.

FIG. 2A illustrates an example of a traditional analysis for performing constant propagation. Specifically, this figure shows the constant propagation is only performed when a variable m has a constant value 0, which means the variable m is assigned the value 0 and always maintains the same value throughout. When a variable does not have a constant value, e.g., when the variable is assigned different values at different times or under different conditions, the constant propagation is not performed. As a result, the amount of unreachable code that can be discovered by the traditional constant propagation technique is limited by the number of variables that have a constant value.

FIG. 2B illustrates an example of an analysis for performing constant propagation in accordance with one embodiment. Specifically, this figure shows the constant propagation is performed even when a variable m does not have a constant value, e.g., is assigned different values under different conditions.

In the example shown in FIG. 2B, the variable m is assigned the value 0 when the variable a does not have a value of 0, and m is assigned the value 2 when the variable a has a value of 2. This means the variable m may have the value 0 or it may have the value 2. Under the traditional analysis for performing constant propagation described in FIG. 2A above, no constant propagation will be performed because m does not have a constant value.

In one embodiment, instead of not performing constant propagation, an analysis is conducted to identify impossible values of m (i.e., the values that cannot be assigned to m) and propagate these identified impossible values. In one embodiment, the new analysis analyzes impossible values at the bit level in multi-bit variables. In this example, the analysis may determine that m cannot have the value of 1, 3, 4, or many other values, and these identified impossible values may then be propagated throughout the program code. The new analysis may also identify that m cannot be an odd number, or above a certain value, or is constrained in some other way. Such attributes of m may then be propagated throughout the program code. These impossible values are propagated to other expressions of the program code and the propagated impossible values are used to identify any code coverage targets that can never be reached.

Because the new analysis enables a variation of constant propagation, even when a variable does not have a constant value, more unreachable code can be discovered. Thus, the program code can be further optimized compared to using the traditional analysis in determining constant propagation. The testing of the program code can be more efficient because more unreachable code coverage targets can be removed because of the application of the new analysis in determining constant propagation. Moreover, by identifying more unreachable targets, targets that may not be intentionally unreachable can be discovered. For simplicity, this method is referred to herein as enhanced constant analysis, and the prior art method is referred to as traditional constant propagation. Although this analysis may be applicable to any compiled code, it is particularly useful in compiling code written in a hardware description language, because as a general matter most variables have one of three values (0, 1, and undefined). This simplifies the determination of impossible values.

Figure 3:
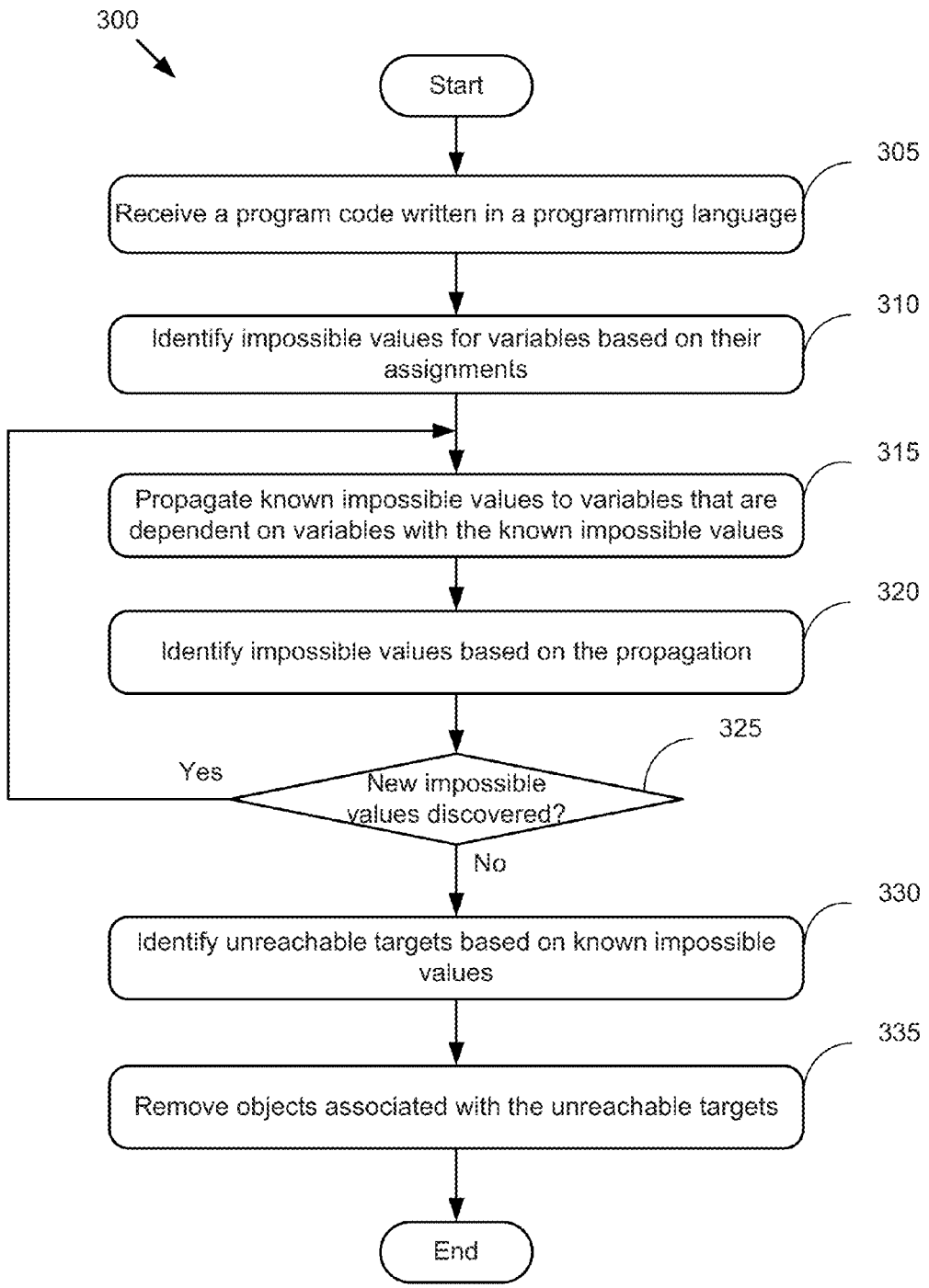
FIG. 3 is an overview flowchart of one embodiment of determining unreachable targets.

FIG. 3 is an overview flowchart of one embodiment of determining unreachable targets. Specifically, this figure describes a process 300 that identifies impossible values for variables in program code, as described above with respect to FIG. 2B. In one embodiment, the process 300 starts when a program code is being compiled or a circuit design written in HDL is being synthesized. The process 300 begins by receiving, at block 305, a program code written in a programming language. In one embodiment, the program code is in the form of data stored on machine readable media.

At block 310, the process 300 identifies impossible values for a set of variables in the program code based on their port connects or assignments. A port connect passes value from one variable to another variable. An assignment sets and/or re-sets the value for a variable.

For each variable, the process 300 determines impossible values based on at least two values of the variable. In one embodiment, this means that the variable is not a true constant, and there are at least two possible values for the variable. In one embodiment, one value of the at least two values of the variable can be an unknown value, which occurs when the variable is not assigned any value.

The system then, based on an analysis of the identified possible variables, determines impossible values for the variable. In one embodiment, the impossible values may include value limitations, e.g. less than 10, odd number, etc., rather than actual values. In one embodiment, the impossible values are determined based on certain heuristics. For example, the process 300 can look at the possible values for the variable and determine whether it is impossible for the variable to have a value of '0' or '1'. In one embodiment, the new analysis analyzes impossible values at the bit level in multi-bit variables.

At block 315, the process 300 propagates known impossible values to variables that are dependent on variables with the known impossible values, i.e., to port connects or assignments that receive or use the variables with the known impossible values. The process, at block 320, identifies new impossible values for dependent variables based on the propagation. The approach for identifying new impossible values for the dependent variables is the same as the approach for identifying impossible values for their parent variables described at block 310 above.

In one embodiment, since variables in HDLs can be assigned from multiple locations with no direct control flow relationship, reaching definitions model does not apply in the propagation of the impossible values. For example, two independent processes both sensitive to posedge clock can assign values to the same variable 'a'. Because of this, there is no way to use a direct control flow relationship to determine the relationship between those two definitions.

At block 325, the process 300 determines whether new impossible values have been discovered. If new impossible values are discovered, the process 300 loops back to block 315 to propagate the newly discovered impossible values. If there are no new impossible values discovered, the process 300 continues to block 330.

At block 330, the process 300 identifies unreachable targets based on known impossible values. Unreachable targets include any targets that can only be reached when the variable has the impossible value. For example, for variable m that has possible values of 1, 3, and 5, a logic branch that reads "when m is 10, action X" the action X is an unreachable target.

At block 325, the process 300 removes objects associated with the unreachable targets. In one embodiment, the process 300 removes objects associated with the unreachable targets by deleting unreachable code corresponding to the unreachable targets. In one embodiment, the objects being deleted may include the decision block that goes to the unreachable value, and the elements associated with that branch. In another embodiment, only the code/elements associated with that branch are deleted. In one embodiment, the process 300 removes objects associated with the unreachable targets by not synthesizing the circuit blocks in the circuit design corresponding to the unreachable targets. In one embodiment, the process 300 removes objects associated with the unreachable targets by eliminating the unreachable targets from the testing procedure. The process 300 then ends.

One of ordinary skill in the art will recognize that the process 300 is a conceptual representation of the operations used to determine unreachable targets through identifying impossible values of variables. The specific operations of the process 300 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 300 is performed by one or more software applications that execute on one or more computers.

The process 300 is low cost in CPU time and memory use compared to other compiler optimizations techniques such as formal proofs or symbolic simulation. Formal proof based techniques require synthesizable code as input. Executing optimization techniques with formal proofs and/or symbolic simulation can be expensive in CPU time, have a large runtime overhead, and require special setup by the user. The process 300 of removing unreachable targets can take as input non-synthesizable code, has a low computational cost, and can find a reasonable number of unreachable targets that cannot be discovered by the traditional constant propagation technique.

In one embodiment, process 300 can be performed prior to the formal proofs or symbolic simulation methods, in order to remove unreachable targets. This reduces the overall cost and the total duration of other, more expensive, compiler optimization operations. In one embodiment, the operations of process 300 are followed by both the formal proofs and the symbolic simulation methods, each of which processes a part of the program code.

Figure 4:
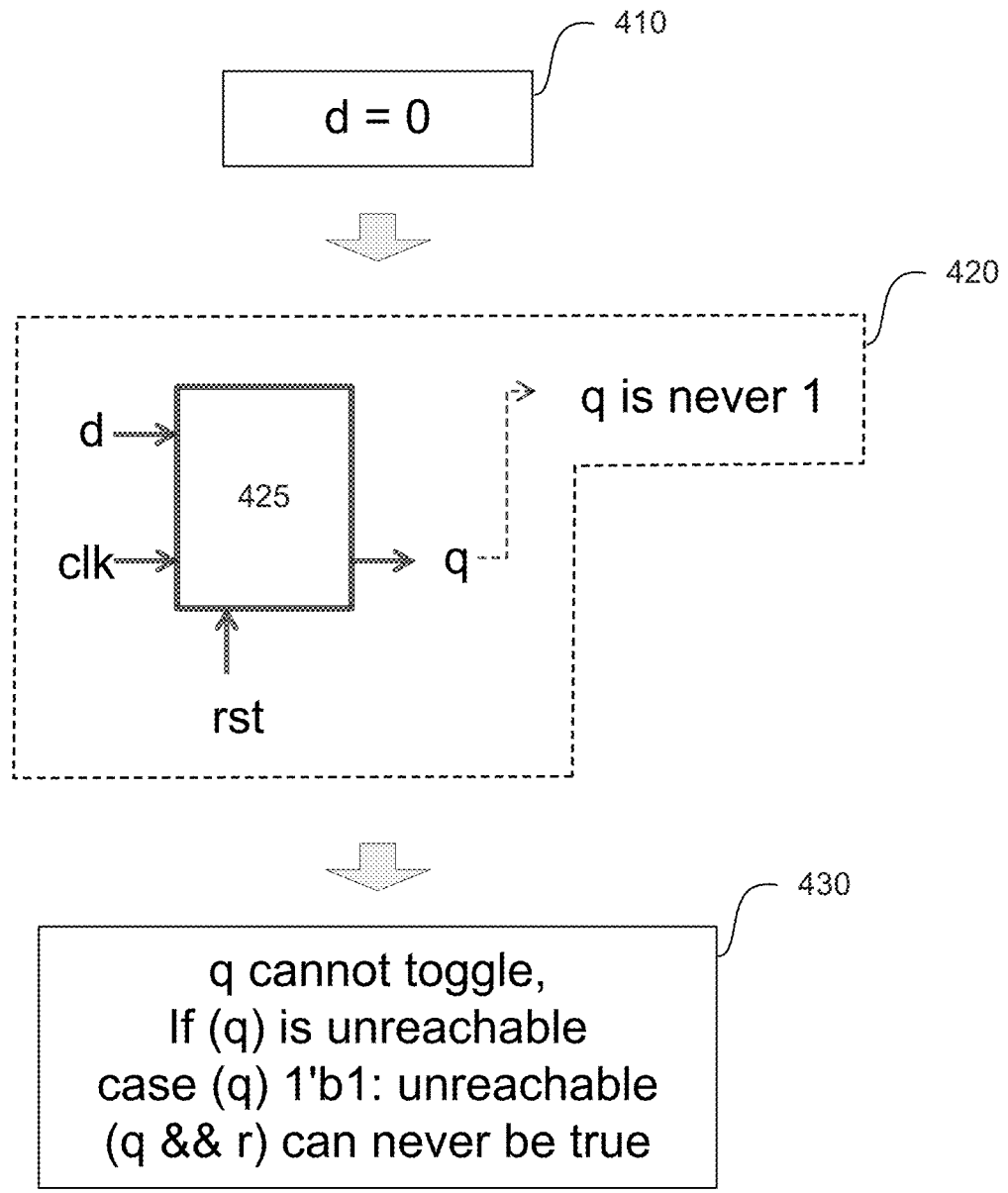
FIG. 4 is an example of propagating impossible values and identifying unreachable targets.

FIG. 4 is an example of propagating impossible values and identifying unreachable targets in accordance with one embodiment. In the first step 410, it is discovered that a variable d is always assigned the value 0. In the second step 420, the value of the variable d is propagated to a variable q through a flip-flop 425. Specifically, the variable q captures the value of the variable d at the rising edge of the clock signal clk, while the value of q is "unknown" when the clock signal clk is not set. Because the variable q does not have a constant value (could be 0 or unknown), constant propagation cannot be performed for the value of q under the traditional analysis described in FIG. 2A above. However, under the new analysis described in FIG. 2B above, an impossible value for q, i.e., q can never be 1, can be identified and propagated.

In the third step 430, because it was identified in the second step 420 that q has an impossible value of 1, several unreachable targets can be identified. For example, q cannot toggle, the statements under the condition if (q) are unreachable, the statements under the case condition case (q) 1'b1: are unreachable, (q && r) can never be true, and so on. These unreachable targets may not have been identified if the old analysis was used and no constant propagation performed with regard to the impossible value of q.

Figure 5:
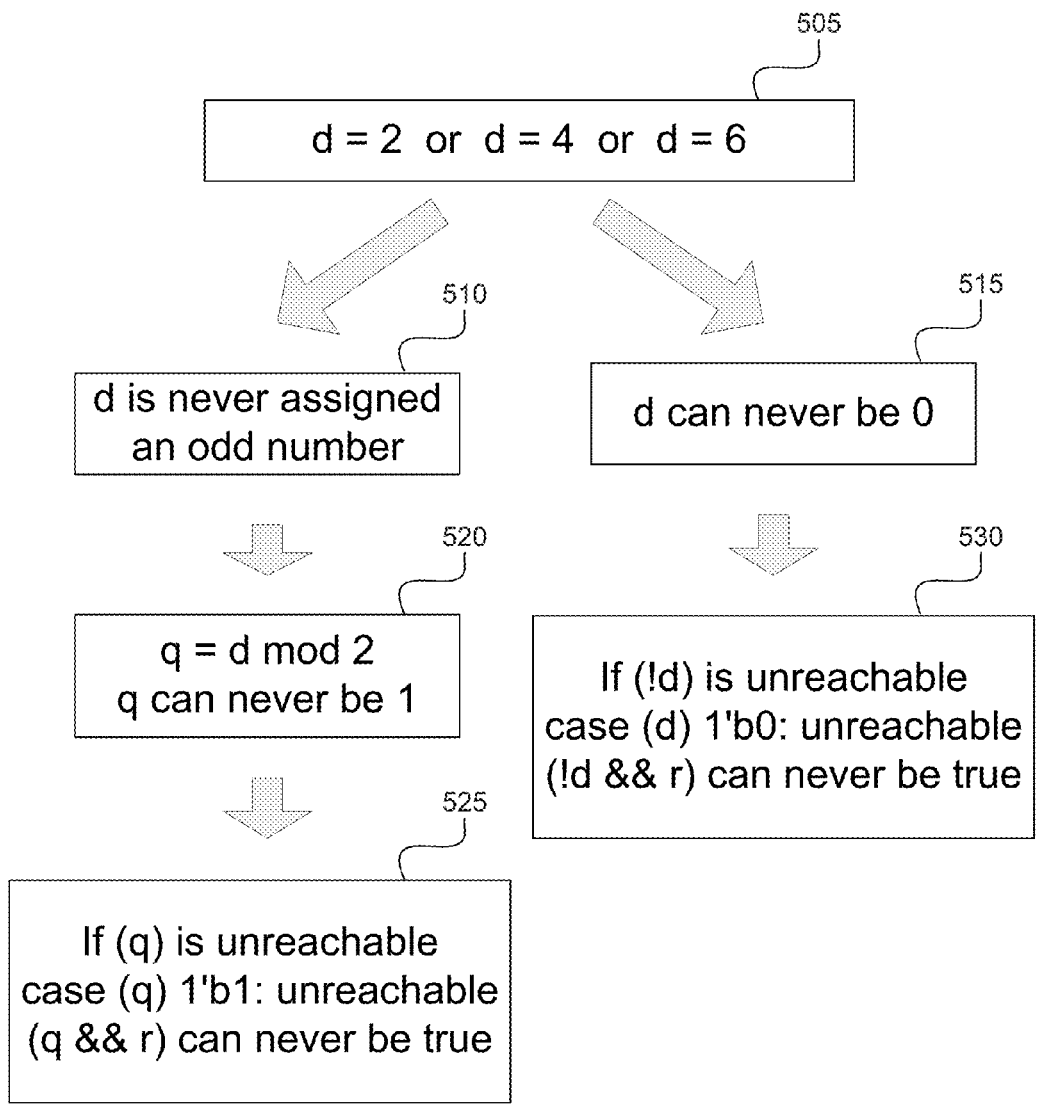
FIG. 5 is another example of propagating impossible values and identifying unreachable targets.

FIG. 5 is another example of propagating impossible values and identifying unreachable targets in accordance with one embodiment. Specifically, this figure illustrates an example of impossible value propagation and unreachable target identification.

At block 505, it is discovered that a variable d is assigned the value of 2, 4, or 6. Because the variable d does not have a constant value, constant propagation cannot be performed for the value of d under the traditional analysis described in FIG. 2A above. However, under the new analysis described in FIG. 2B above, impossible values for d can be identified and propagated. In this example, because of the values assigned to the variable d at block 505, two impossible values for d can be identified at blocks 510 and 515. At block 510, it is identified that d is never assigned an odd number. At block 515, it is identified that d can never be 0.

At block 520, the impossible value of the variable d identified at block 510 is propagated to a variable q, which equals to d mod 2. Because it is identified at block 510 that d is never assigned an odd number, q can never be 1.

At block 525, because q can never be 1, several unreachable targets can be identified. For example, the statements under the condition if (q) are unreachable, the statements under the case condition case (q) 1'b1: are unreachable, (q && r) can never be true, and so on. These unreachable targets may not have been identified if the old analysis was used and no constant propagation performed with regard to the impossible values of d.

At block 530, because it is identified at block 515 that d can never be 0, several unreachable targets can be identified. For example, the statements under the condition if (!d) are unreachable, the statements under the case condition case (d) 1'b0: are unreachable, (!d && r) can never be true, and so on. These unreachable targets may not have been identified if the old analysis was used and no constant propagation performed with regard to the impossible values of d.

Figure 6:
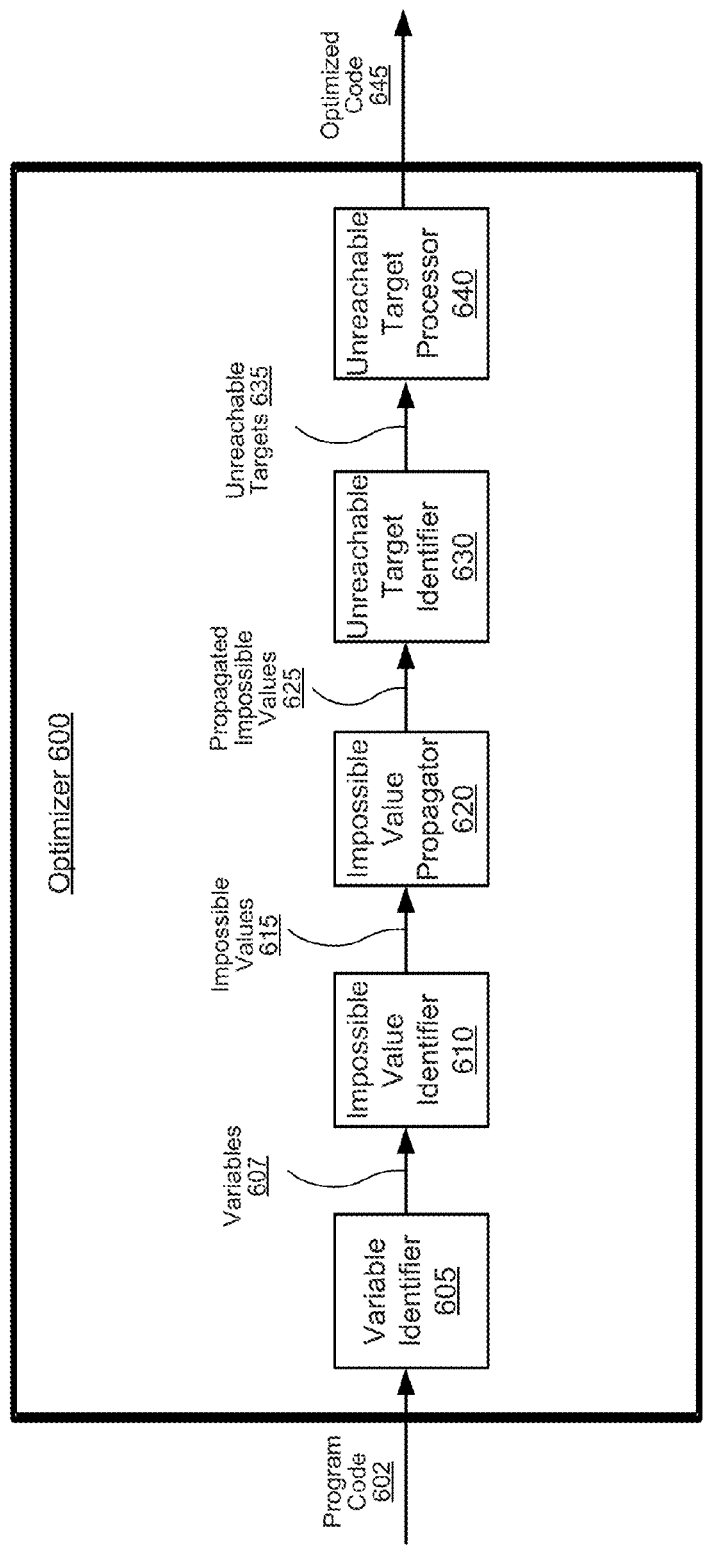
FIG. 6 conceptually illustrates one embodiment of an optimizer.

FIG. 6 conceptually illustrates one embodiment of an optimizer 600. In one embodiment, the optimizer 600 is a standalone system. In another embodiment, the optimizer 600 is part of a compiler system. In yet another embodiment, the optimizer 600 is part of a system for performing electronic design automation (EDA) operations. As shown in the figure, in one embodiment, the optimizer 600 includes a variable identifier 605, an impossible value identifier 610, an impossible value propagator 620, an unreachable target identifier 630, and an unreachable target processor 640.

The variable identifier 605 receives program code 602. The variable identifier 605 identifies variables 607 by parsing the program code 602. The impossible value identifier 610 receives the variables 607 from the variable identifier 605 and determines impossible values 615 for the variables 607. In one embodiment, the impossible value identifier 610 determines impossible values for a variable based on at least two values of the variable. In one embodiment, at least two values of the variable means at least two values assigned to the variable. In one embodiment, one value of the at least two values of the variable can be an unknown value, which occurs when the variable is not assigned any value. In one embodiment, the impossible values for one variable may be dependent on the impossible values for another variable. In one embodiment, the impossible value identifier 610 identifies impossible values 615 based on certain heuristics. For example, the impossible value identifier 610 can look at the possible values for a variable with the possible values of undefined, 0, and 1, and determine whether it is impossible for the variable to have a value of '0' or '1'. Generally, in a hardware description language-based design, most variables have as possible values only 0, 1, and undefined.

The impossible value propagator 620 then propagates the identified impossible values 615 throughout the program code 602 to generate propagated impossible values 625. The unreachable target identifier 630 receives the propagated impossible values 625 from the impossible value propagator 620 and identifies unreachable targets 635 based on the propagated impossible values 625.

The unreachable target processor 640 receives the unreachable targets 635 from the unreachable target identifier 630 and processes the unreachable targets 635. In one embodiment, the unreachable target processor 640 processes the unreachable targets 635 by deleting the corresponding unreachable code from the program code 602. In one embodiment, the unreachable target processor 640 processes the unreachable targets 635 by not synthesizing the circuit blocks in the circuit design corresponding to the unreachable targets 635. In one embodiment, the unreachable target processor 640 processes the unreachable targets 635 by eliminating the unreachable targets 635 from the testing procedure. The unreachable target processor 640 produces the optimized code 645 as the output of the optimizer 600.

The optimizer 600 is described above for one embodiment of the invention. One of ordinary skill in the art will realize that in other embodiments this module can be implemented differently. For instance, in one embodiment described above, certain modules are implemented as software modules. However, in another embodiment, some or all of the modules of the optimizer 600 might be implemented by hardware, which can be dedicated application specific hardware (e.g., an ASIC chip or component) or a general purpose chip (e.g., a microprocessor or FPGA).

This description and drawings are illustrative of embodiments of the invention and are not to be construed as limiting the invention. Numerous specific details are described to provide a thorough understanding of the disclosed embodiments. However, in certain instances, well known or conventional details are not described in order to avoid obscuring the description of the disclosed embodiments. References to "an" or "one" embodiment in the present disclosure are not necessarily to the same embodiment; such references mean at least one embodiment.

Many of the methods of the disclosed embodiments may be performed with a digital processing system, such as a conventional, general-purpose computer system. Special purpose computers, which are designed or programmed to perform only one function, may also be used.

Figure 7:
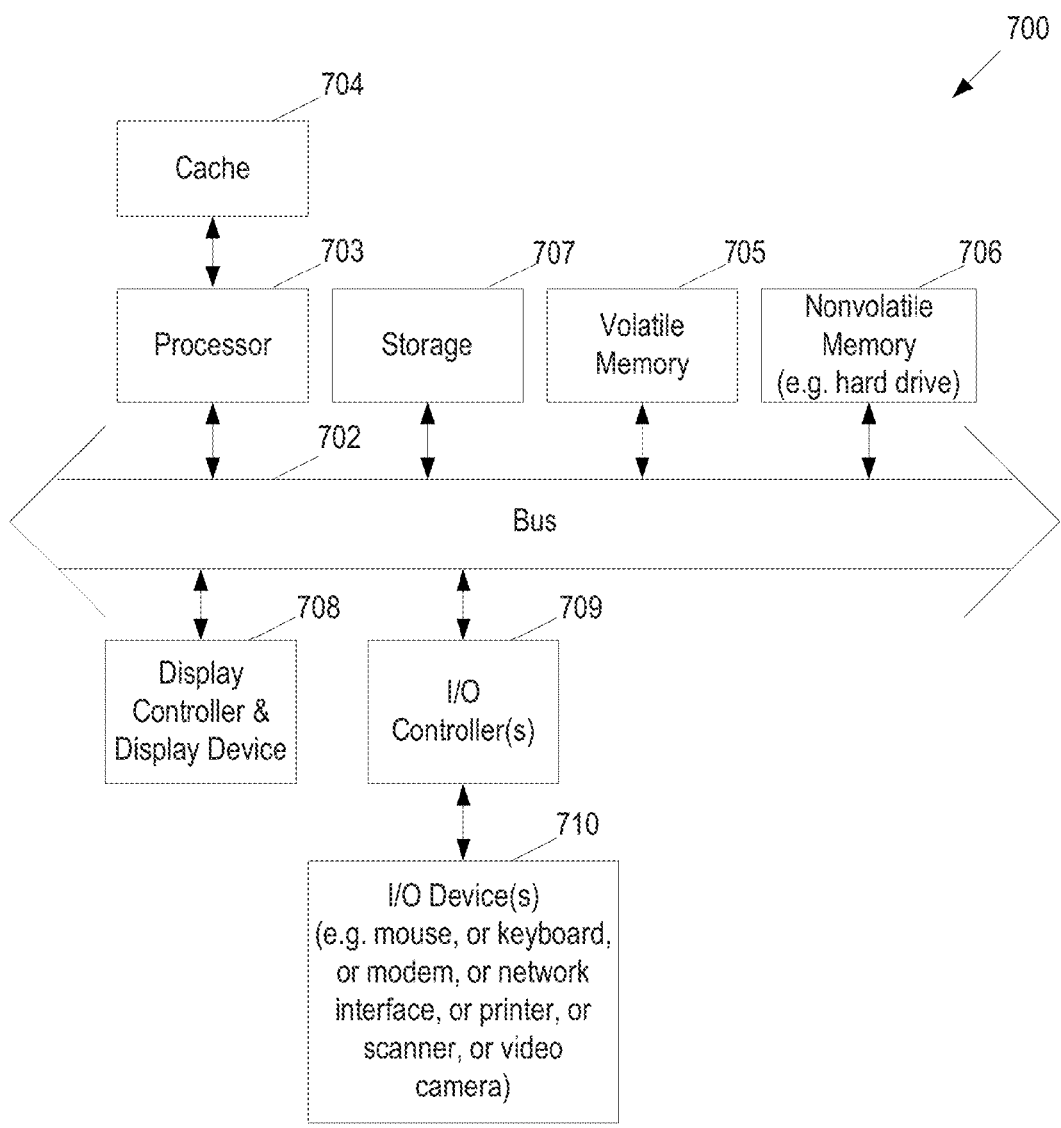
FIG. 7 shows one example of a typical computer system or data processing system that may be used with the disclosed embodiments.

FIG. 7 shows one example of a typical computer system or data processing system that may be used with the disclosed embodiments. For example, in one embodiment the process described with respect to FIG. 3 is operational through the example computing system. However, it is noted that while FIG. 7 illustrates various components of a computer system, it is not intended to represent any particular architecture or manner of interconnecting the components but rather provides an example representation of how the components and architecture may be configured. It will also be appreciated that network computers and other data processing systems that have fewer components or perhaps more components may also be used with the disclosed embodiments. The computer system of FIG. 7 may be any computing system capable of performing the described operations.

As shown in FIG. 7, the computer system 700, which is a form of a data processing system, includes a bus 702, which is coupled to one or more microprocessors 703. In one embodiment, computer system 700 includes one or more of a storage device (e.g., ROM) 707, volatile memory (e.g., RAM) 705, and a non-volatile memory (EEPROM, Flash) 706. The microprocessor 703 is coupled to cache memory 704 as shown in the example of FIG. 7. Cache memory 704 may be volatile or non-volatile memory.

The bus 702 interconnects these various components together and in one embodiment interconnects these components 703, 707, 705, and 706 to a display controller and display device 708. The computer system 700 may further include peripheral devices such as input/output (I/O) devices, which may be mice, keyboards, modems, network interfaces, printers, scanners, video cameras and other devices which are well known in the art. Typically, the input/output devices 710 are coupled to the system through input/output controllers 709.

The volatile memory 705 is typically implemented as dynamic RAM (DRAM), which requires power continually in order to refresh or maintain data in the memory. The non-volatile memory 706 is typically a magnetic hard drive, magnetic optical drive, an optical drive, a DVD RAM, a Flash memory, or other type of memory system which maintains data even after power is removed from the system. Typically, the non-volatile memory will also be a random access memory, although this is not required.

While FIG. 7 shows that the non-volatile memory is a local device coupled directly to the rest of the components in the data processing system, it will be appreciated that the disclosed embodiments may utilize a non-volatile memory which is remote from the system, such as a network storage device which is coupled to the data processing system through a network interface such as a modem or Ethernet interface.

The bus 702 may include one or more buses connected to each other through various bridges, controllers and/or adapters as is well known in the art. In one embodiment the I/O controller 709 includes a USB (Universal Serial Bus) adapter for controlling USB peripherals, and/or an IEEE-1394 bus adapter for controlling IEEE-1394 peripherals.

It will be apparent from this description that aspects of the disclosed embodiments may be embodied, at least in part, in software (or computer-readable instructions). That is, the techniques of, for example, the process of FIG. 3, may be carried out in a computer system or other data processing system in response to its processor, such as a microprocessor, executing sequences of instructions contained in a memory, such as storage device 707, volatile memory 705, non-volatile memory 706, cache 704 or a remote storage device. In various embodiments, hardwired circuitry may be used in combination with software instructions to implement the disclosed embodiments. Thus, the techniques are not limited to any specific combination of hardware circuitry and software or to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as microprocessor 703.

A machine readable storage medium can be used to store software and data which when executed by a data processing system causes the system to perform various methods of the disclosed embodiments. This executable software and data may be stored in various places including, for example, storage device 707, volatile memory 705, non-volatile memory 706 and/or cache 704 as shown in FIG. 7. Portions of this software and/or data may be stored in any one of these storage devices.

Thus, a machine readable storage medium includes any mechanism that stores any information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

The detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The detailed description is, therefore, not to be taken in a limiting sense, and the scope of the present invention is defined by the appended claims.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some portions of the detailed description were presented as procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals of a computer readable storage medium and are capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "sending" or "receiving" or "displaying" or "calculating" or "determining" or "multiplying" or "computing" or "identifying" or "generating" or "transforming" the like, refer to the action and processes of a computer system, or similar electronic computing device that manipulates and transforms data represented as physical (electronic) quantities within the computer system's registers and memories and other computer readable media into other data similarly represented as physical quantities within the computer system's memories or registers or other such information storage, transmission or display devices.

In the foregoing specification, the disclosed embodiments have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

I claim:

1. A computer-implemented method of optimizing a circuit design described by a program code written in hardware description language (HDL), the method comprising:
   receiving a description of the program code;
   determining one or more impossible values for a variable in the program code based on a plurality of potential values of the variable;
   propagating the one or more impossible values of the variable to other variables that are dependent on the variable in the program code;
   identifying, using a computing device, a set of unreachable targets in the program code based on the one or more impossible values for the variable, the propagating, and the description of the program code;
   removing objects associated with the set of unreachable targets.

2. The method of claim 1, wherein the removing of the objects associated with the set of unreachable targets comprises one or more of:
   removing circuits corresponding to the set of unreachable targets from synthesizing;
   deleting code corresponding to the set of unreachable targets from the program code;
   removing the objects associated with the set of unreachable targets from testing; and removing the objects associated with the set of unreachable targets from calculation of code coverage.

3. The method of claim 1, wherein the HDL is one of Verilog and VHDL.

4. The method of claim 1, wherein the plurality of values of the variable are values assignable to the variable.

5. The method of claim 1, wherein one of the plurality of values of the variable is an unknown value, wherein the unknown value occurs when the variable is not assigned a value.

6. The method of claim 1, further comprising propagating the one or more impossible values for the variable throughout the program code, wherein the identifying of the set of unreachable targets is based on the propagated impossible values.

7. The method of claim 6, wherein the variable is a first variable, the method further comprising:
 identifying a second variable that is dependent on the first variable;
 determining one or more impossible values for the second variable based on the one or more impossible values of the first variable; and
 propagating the one or more impossible values for the second variable throughout the program code.

8. A data processing system having a processor for optimizing a circuit design described by a program code written in hardware description language (HDL), the data processing system comprising:
 a unit to receive a description of the program code,
 an impossible value identifier to identify one or more impossible values for a variable in the program code based on a plurality of values of the variable;
 an unreachable target identifier to identify a set of unreachable targets in the program code based on the one or more impossible values for the variable and the description of the program code, including propagation of the impossible values to other variables which depend on the variable; and
 an unreachable target processor to process the set of unreachable targets based at least in part on the propagation.

9. The data processing system of claim 8, further comprising an impossible value propagator to propagate the one or more impossible values for the variable throughout the program code, wherein the unreachable target identifier identifies the set of unreachable targets based on the propagated impossible values.

10. The data processing system of claim 8, further comprising a variable identifier to identify variables in the program code.

11. The data processing system of claim 8, wherein the unreachable target processor processes the set of unreachable targets by deleting code corresponding to the set of unreachable targets from the program code.

12. The data processing system of claim 8, wherein the plurality of values of the variable are values assignable to the variable.

13. The data processing system of claim 8, wherein one of the plurality of values of the variable is an unknown value, wherein the unknown value occurs when the variable is not assigned a value.

14. A computer program product stored as instructions on a non-transitory computer-readable medium, the instructions executable by at least one processor for optimizing a circuit design described by a program code written in hardware description language (HDL), the computer program product comprising instructions for:
 receiving a description of the program code,
 determining, based on a plurality of values of a variable in the program code, one or more impossible values for the variable;
 propagating the one or more impossible values of the variable to other variables that are dependent on the variable in the program code;
 identifying a set of unreachable targets in the program code based on the one or more impossible values for the variable, the propagating, and the description of the program code; and
 removing objects associated with the set of unreachable targets.

15. The computer program product of claim 14, wherein the instructions for removing objects associated with the set of unreachable targets comprise one or more of:
 instructions for deleting code corresponding to the set of unreachable targets from the program code;
 instructions for removing the objects associated with the set of unreachable targets from testing; and
 instructions for removing the objects associated with the set of unreachable targets from calculation of code coverage.

16. The computer program product of claim 14, wherein the HDL is one of Verilog and VHDL.

17. The computer program product of claim 14, wherein the computer program product further comprises instructions for propagating the one or more impossible values for the variable throughout the program code, wherein the identifying of the set of unreachable targets is based on the propagated impossible values.

18. The computer program product of claim 17, wherein the variable is a first variable, the computer program product further comprising instructions for:
 identifying a second variable that is dependent on the first variable;
 determining one or more impossible values for the second variable based on the one or more impossible values of the first variable; and
 propagating the one or more impossible values for the second variable throughout the program code.

19. The computer program product of claim 14, wherein the plurality of values of the variable are values assignable to the variable.

20. The computer program product of claim 14, wherein one of the plurality of values of the variable is an unknown value, wherein the unknown value occurs when the variable is not assigned a value.

21. A computer-implemented method comprising, upon receiving a description of program code:
 determining one or more impossible values for a variable in the program code based on a plurality of potential values of the variable;
 propagating the one or more impossible values to the variable to other variables that are dependent on the variable in the program code;
 identifying, using a computing device, a set of unreachable targets in the program code based on the one or more impossible values for the variable, the propagating, and the description of the program code;
 removing objects associated with the set of unreachable targets.

\* \* \* \* \*